United States Patent [19]
Katsube

[11] Patent Number: 5,894,486
[45] Date of Patent: Apr. 13, 1999

[54] CODING/DECODING APPARATUS

[75] Inventor: Ryoji Katsube, Tokyo, Japan

[73] Assignee: NEC Corporation, Tokyo, Japan

[21] Appl. No.: 08/630,880

[22] Filed: Apr. 2, 1996

[51] Int. Cl.[6] ................................................. G06F 11/00
[52] U.S. Cl. ...................... 371/55; 371/57.1; 364/265.2; 364/944.5
[58] Field of Search .................... 371/55, 57.1, 37.1, 371/37.2, 37.3, 37.7; 358/427, 261.1; 364/265, 265.1, 265.2, 259.9, 942.8, 944.5; 395/185.01, 185.02, 185.05

[56] References Cited

U.S. PATENT DOCUMENTS

| | | | |
|---|---|---|---|
| 4,688,108 | 8/1987 | Cotton et al. | 358/261.1 |
| 4,843,632 | 6/1989 | Lee et al. | 358/261.1 |
| 5,093,831 | 3/1992 | Serizawa et al. | 371/37.1 |
| 5,184,229 | 2/1993 | Saito et al. | 358/427 |
| 5,303,245 | 4/1994 | Shikakura et al. | 371/37.1 |
| 5,566,002 | 10/1996 | Shikakura | 358/427 |

OTHER PUBLICATIONS

"Computer System Architecture" $2^{nd}$ Ed., M. Morris Mano pp. 421–426. Prentice–Hall, Inc. 1982.

Primary Examiner—Trinh L. Tu
Attorney, Agent, or Firm—Scully, Scott, Murphy & Presser

[57] ABSTRACT

A coding/decoding apparatus for high-speed and reliable detection of even an error which has occurred in the compressing division or between the compressing division and the error correcting division in the coding unit. The coding/decoding apparatus is equipped with, in addition to error correcting means and decompressing means, means for detecting production of data other than statistical coded data, in inputted data, means for detecting an error related to end-of-block data, means for detecting an error related to cyclic signals inserted in the inputted data, and means for detecting an error related to the total number of blocks in each frame.

7 Claims, 3 Drawing Sheets

5,894,486

1

CODING/DECODING APPARATUS

BACKGROUND OF THE INVENTION

1. Field of the Invention

The present invention relates to a coding/decoding apparatus for pictures, sounds, data, etc., and more particularly to a coding/decoding apparatus with an improved circuit for detecting errors in data which have occurred in a compression division or between the compression division and an error correcting division at the sending end, by a receiving unit.

2. Description of the Prior Art

Data compressing/decompressing apparatuses for transmission according to the prior art are designed, as illustrated in FIG. 4, so that error correcting circuits 4 and 5 according to Viterbi, Reed-Solomon, etc., which are mounted in a coding unit 1 and a decoding unit 2, detect an error which has occurred in a transmission line B.

In addition, since errors which have occurred in a compressing division 3 and the interface between the compressing division 3 and an error correcting division 4 in the coding unit 1 cannot be detected by the error correcting division 5 in the decoding unit 2, conventionally, cyclic signals are inserted into an inputted original picture signal or the like which is then compressed through the coding unit 1, and the decoding unit 2 which has received the compressed data decompresses the data in a decompressing division 6, and verifies the data to detect an error.

As mentioned above, with a coding/decoding apparatus of the prior art, original data with cyclic signals are inserted therein undergoes data compression according to variable length coding, and the decoded data is verified in the decoding unit to detect an error.

This mechanism, however, has a problem in that error-mixed data, even once processed by decompression, may cause the cyclic data to be produced depending on the contents of the data, and thus detection of errors may become impossible. In addition, since errors can be detected only at intervals of reception of the cyclic data, errors cannot be detected in early stages.

SUMMARY OF THE INVENTION

Considering the problems mentioned above, it is an object of the present invention to provide a coding/decoding apparatus for detecting an error at a high speed and with reliability.

In order to accomplish the object mentioned above, the present invention provides a coding/decoding apparatus equipped with error correcting means and decompressing means, characterized by further comprising means for detecting production of data other than statistical coded data, in inputted data; means for detecting an error related to end-of-block data; means for detecting an error related to cyclic signals inserted in the inputted data; and means for detecting an error related to the total number of blocks in each frame.

Compressed data to be inputted to the decoding unit preferably is processed by forming blocks of a predetermined number of data, inserting end-of-block data at the end of each block, forming block lines of a predetermined number of the blocks, appending a block line header to each block line, and forming frames of a predetermined number of the block lines. According to a preferred embodiment, the present invention is a coding/decoding apparatus for decoding an inputted string of compressed data via an error

2 correcting circuit and a decompressing circuit, characterized by being equipped with a code identification circuit for comparing the string of data outputted from the error correcting circuit with a variable length coding table to resolve the string of data into individual code data, and separating the cyclic signals in the block line headers from the compressed data; a code comparator circuit for receiving the code data outputted from the code identification circuit to detect the presence or absence of a code other than variable length coded data in the inputted code data; a block number comparator circuit for making a comparison to determine whether the number of blocks in each frame is equal to a predetermined value; a cyclic signal comparator circuit for checking the cyclic signals separated from the block line headers to determine whether the inputted data is correct or not; and an error detecting circuit for sending a control signal to the decompressing circuit, depending on an error which has occurred in the respective circuits.

DETAILED DESCRIPTION

The coding/decoding apparatus according to the present invention is constructed by providing the apparatus explained as an example of the prior art, that is, the circuits which compress original data with cyclic signals inserted therein according to variable length coding, and verify the decoded data in the decoding unit to detect an error, with (1) a statistical code (e.g., Huffman code) identification circuit, and a circuit for detecting production of a code not found in the statistical codes, for detection of an error per code; and (2) a data number counting circuit for verifying the total number of data in each frame, and this configuration ensures faster and more reliable detection of an error in data. In other words, the present invention allows fast detection of an error in data which has occurred in the compressing division or between the compressing division and the error detecting division in the coding unit.

Detailed Description of the Preferred Embodiments

Embodiments of the present invention will now be explained with reference to the drawings.

Figure 1:
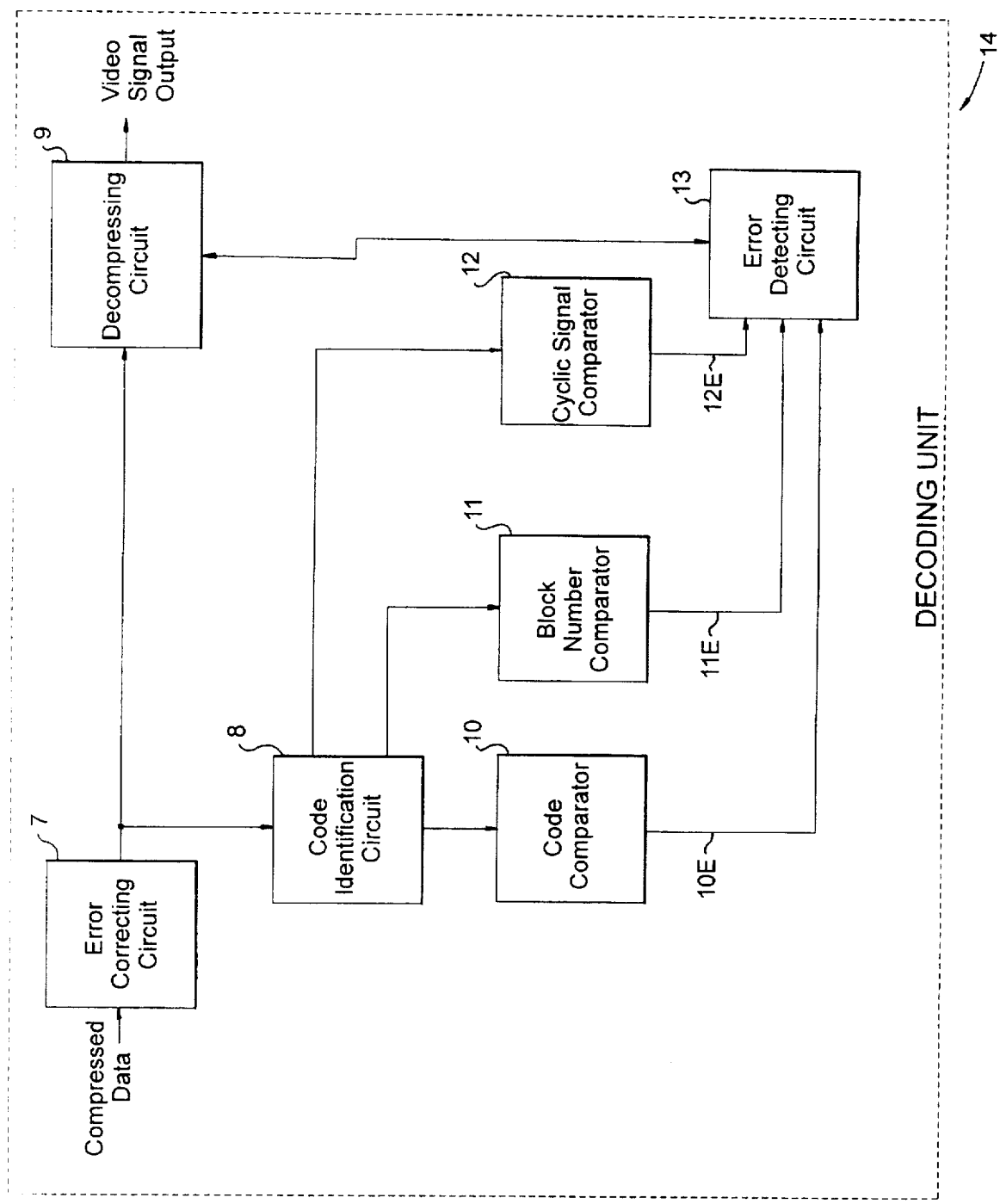
FIG. 1 is a view illustrative of the structure of an embodiment of the present invention.
Figure 2:
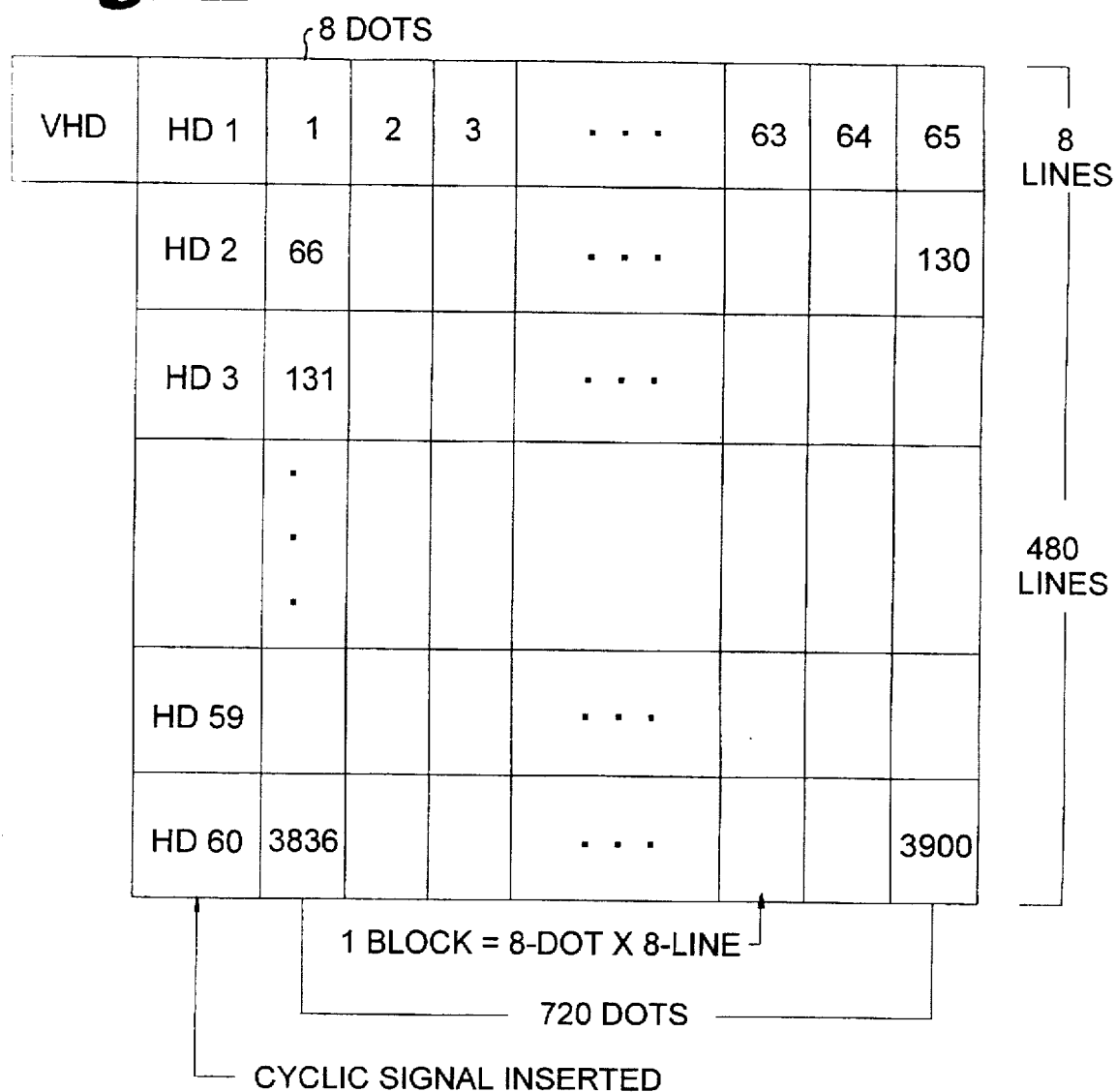
FIG. 2 is a view illustrative of an example of the format for one frame of an original picture signal.
Figure 3:
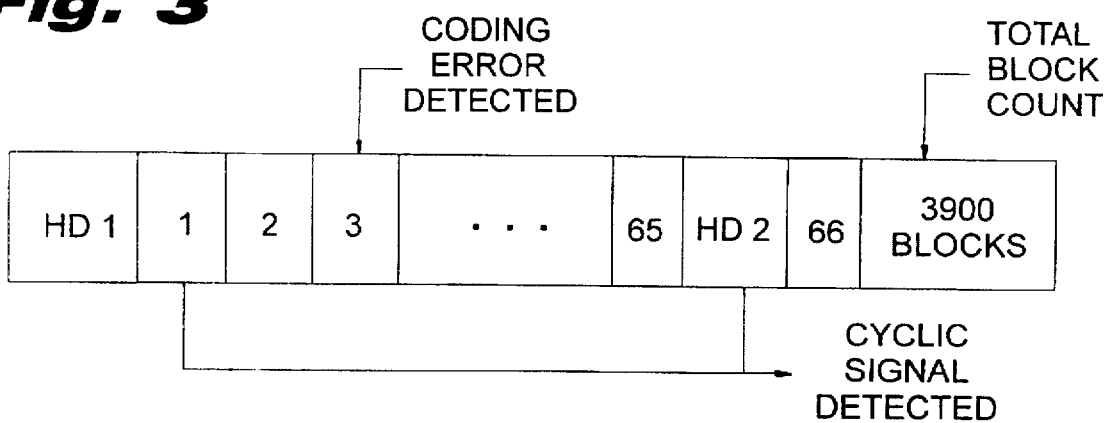
FIG. 3 is a view illustrative of the structure of data compressed according to the present invention.
Figure 4:
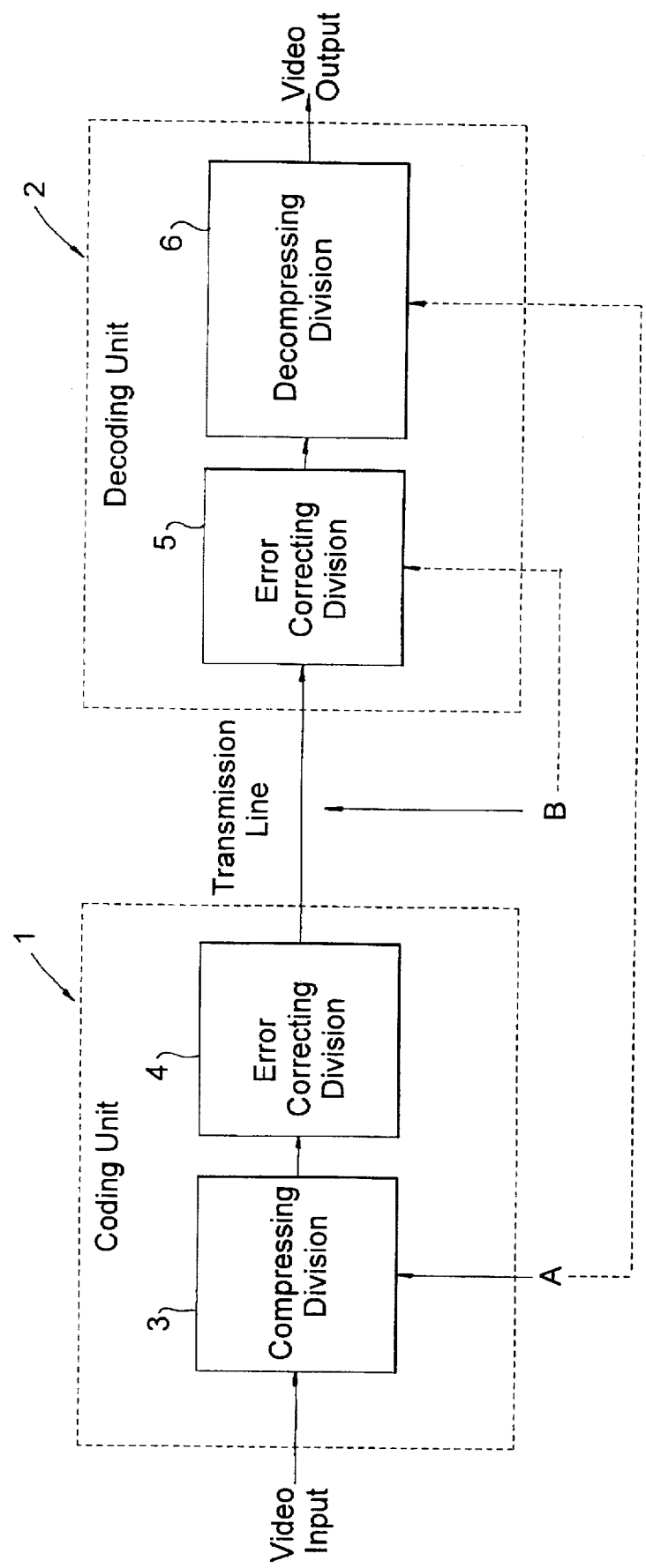
FIG. 4 is a view illustrative of occurrence of errors in and detection thereof by a coding/decoding apparatus of the prior art.

FIG. 1 illustrates an embodiment according to the present invention. FIG. 2 illustrates the format of an original picture signal for each frame. FIG. 3 illustrates the data structure after compression.

The compressed data to be inputted to a decoding unit 14 will now be explained in advance. An original picture signal is compressed according to the format illustrated in FIG. 2 frame by frame, and as a result, is converted into a string of data as illustrated in FIG. 3.

Referring to FIG. 2, the data in one block of the picture signal is divided horizontally by 8 dots and vertically by 8 lines for compression on a block basis. Here, each frame consists of 720 dots by 480 lines.

Referring to FIG. 2, the data is compressed in 8-bit by 8-line units (hereunder referred to as blocks), and for example, 65 blocks are organized into one block line.

A block line header (HD1, HD2, . . . , or HD60) is appended to the top of each block line.

Each frame includes 60 block lines, and a frame header (VHD) is appended to the top of the data in the frame.

A cyclic signal is inserted in each block line header. For example, the block line headers are set to HD1="000001"b, HD2="000010"b, . . . , and HD60="111100"b ("b" indicates binary notation).

The data in each block, being converted to data variable in length when compressed according to Huffman coding, becomes a string of data as illustrated in FIG. 3. In other words, referring to FIG. 3, the length of data in each block (1, 2, . . . , 65, etc.) is made variable.

The data in each block is composed of Huffman codes, with an EOB (end of block) code appended to the end of each block.

The structure of the compressed data suggests the following four steps for hierarchical detection of errors in the data.

(1) Verification of individual data in each block;
(2) verification per block;
(3) verification per block line; and
(4) verification per frame.

Methods of detecting errors at the respective levels mentioned above as follows:

Detection of production of data other than Huffman codes for (1) above;

detection of the EOB data for (2) above;

detection of the cyclic signal inserted in each block line header for (3) above; and detection of the total number of blocks in each frame for (4) above.

The present invention is characterized by being equipped with the above-mentioned hierarchical structure for detection of errors.

Referring to FIG. 1, a decoding unit 14 according to the present embodiment is constructed with an error correcting circuit 7, a code identification circuit 8, a decompressing circuit 9, a code comparator circuit 10, a block number comparator circuit 11, a cyclic signal comparator circuit 12, and an error detecting circuit 13. The operation of the present embodiment will now be explained with reference to FIG. 1. Compressed data inputted to the decoding unit 14 is corrected through the error correcting circuit 7 for errors in the data which have occurred in the transmission line, and inputted to the code identification circuit 8.

In the code identification circuit 8, the inputted string of data is compared with the Huffman code table and resolved into individual code data. The code data is inputted to the code comparator circuit 10.

Meanwhile, the code identification circuit 8 detects the EOB and the frame header in each block to generate a block pulse and a frame pulse.

The block pulse and the frame pulse are inputted to the block number comparator circuit 11.

The code identification circuit 8 also separates the cyclic signals in the respective block line headers from the compressed data. The separated cyclic signals are inputted to the cyclic signal comparator circuit 12.

The code comparator circuit 10 detects the presence or absence of codes other than Huffman code data, and detects whether the respective blocks end with the end-of-block (EOB) code. Should an error indicated by detection of a code other than Huffman code data, or the fact that any block does not end with the EOB code, occurs, the code comparator circuit 10 outputs an error pulse 10E to the error detecting circuit 13.

The block number comparator circuit 11, in response to the frame pulse, clears the internal counter to count the block pulses, and makes a comparison to determine whether the number of blocks in each frame is equal to the specified value. In cases where the block count is incorrect, the block number comparator circuit 11 outputs an error pulse 11E to the error detecting circuit 13.

The cyclic signal comparator circuit 12 checks the cyclic signals separated from the block line headers and to make a comparison for determination whether the inputted data is correct or not. In case the data is incorrect, an error pulse 12E is outputted to the error detecting circuit 13.

The error detecting circuit 13 sends signals to the decompressing circuit 9, depending on the errors which have occurred in the respective divisions to initialize the decompression processing, to freeze the picture, and to otherwise control.

Although the present invention was described above with reference to the embodiment, the present invention naturally includes a variety of embodiments thereof based on its principle, without being limited to the embodiment described above. For example, the format of the compressed data shown in FIG. 2, etc. is only illustrative to facilitate understanding of the present invention, and never restricts the present invention.

As explained above, the encoding/decoding apparatus according to the present invention produces the effect of detecting errors in data which have occurred in the compressing division or between the compressing division and the error correcting division, at a high speed and with reliability, by executing (1) detection of production of data other than Huffman codes, (2) detection of EOB data, (3) detection of cyclic signals inserted in block line headers, and (4) detection of the total number of blocks in one frame.

Also, the present invention, being equipped with a hierarchical structure for high-speed detection of errors which have occurred in the compression division and at the interface between the compression division and the error correcting division of the coding unit, serves to increase the levels of signal transmission performance, reliability and speed of coding/decoding apparatuses (video CODECs), etc. for picture signals, etc., for example.

What is claimed is:

1. A decoding apparatus equipped with error correcting means and decompressing means, comprising:

first means for receiving a serial data stream of encoded and compressed binary data from a transmission line, detecting and correcting errors introduced into the serial data stream from the transmission line, and outputting inputted data;

second means for receiving inputted data, decoding said inputted data into individual code data, and cyclic signals.

third means for detecting production of data other than Huffman-modified coded data, in inputted data;

fourth means for detecting an error when each block of coded data does not end with end-of-block data;

fifth means for detecting an error by using cyclic signals inserted in said inputted data; and sixth means for detecting an error by using the total number of blocks in each frame;

whereby said third through sixth means operate in a respectively parallel manner and each said means provides an independent error signal to an error controller;

said error controller providing a control signal to said decompression means.

2. A decoding apparatus as claimed in claim 1, wherein said statistical coded data are variable length coded data.

3. A decoding apparatus for decoding a serial data stream of encoded and compressed binary data received from a transmission line into an inputted string of compressed data where the compressed data has been processed by forming blocks of a predetermined number of data, inserting end-of-block data at the end of each block, forming block lines of a predetermined number of said blocks, appending a block line header to each of said block lines, and forming frames of a predetermined number of said block lines, comprising:

- an error correction circuit for receiving the inputted string of data and correcting data errors introduced by the transmission line;
- a code identification circuit for comparing a string of data outputted from said error correct ion circuit with a variable length coding table to resolve said string of data into individual code data, and separating cyclic signals in the block line headers from the compressed data;
- a code comparator circuit for receiving the code data outputted from said code identification circuit, said code comparator circuit outputting a first error signal when a code other than variable length coded data in the code data is detected by detecting when each block of the coded data does not end with end-of-block data;
- a block number comparator circuit for making a comparison, said block number comparator circuit outputting a second error signal when the number of blocks in each of said frames is different from a predetermined value;
- a cyclic signal comparator circuit for checking the cyclic signals separated from said block line headers, said cyclic signal comparator circuit outputting a third error signal when the cyclic signals indicate that the compressed data is incorrect; and
- a control circuit connected to said code comparator circuit, said block number comparator circuit and said cyclic signal comparator circuit, said control circuit sending a control signal to said decompressing circuit when at least one of said first error signal, said second error signal or said third error signal is detected.

4. A decoding apparatus as claimed in claim 3, further comprising an end-of-block data detecting circuit for detecting whether each of said blocks ends with end-of-block data.

5. A decoding apparatus as claimed in claim 4, wherein said control circuit sends said control signal when said end-of-block data detecting circuit detects that each of said blocks does not end with end-of-block data.

6. A decoding apparatus as claimed in claim 5, wherein said control circuit initializes said decompressing circuit.

7. A decoding apparatus as claimed in claim 5, wherein said control circuit freezes data in said decompressing circuit.

* * * * *